United States Patent
Strack et al.

(10) Patent No.: US 6,309,974 B1
(45) Date of Patent: *Oct. 30, 2001

(54) METHOD FOR ELIMINATING RESIDUAL OXYGEN IMPURITIES FROM SILICON WAFERS PULLED FROM A CRUCIBLE

(75) Inventors: Helmut Strack, München; Jens-Peer Stengl, Grafrath, both of (DE)

(73) Assignee: Infineon Technologies AG, Munich (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/156,732

(22) Filed: Sep. 17, 1998

(30) Foreign Application Priority Data

Sep. 17, 1997 (DE) ................................. 197 40 904

(51) Int. Cl.⁷ ................................................. H01L 21/311
(52) U.S. Cl. ................ 438/700; 438/701; 438/702; 438/706; 438/735; 438/745
(58) Field of Search ........................ 438/700, 735, 438/701, 702, 706, 745

(56) References Cited

U.S. PATENT DOCUMENTS

| 4,789,882 | * | 12/1988 | Lidow | 357/23.4 |
| 4,837,172 | * | 6/1989 | Mizuno et al. | 437/11 |
| 5,169,804 | * | 12/1992 | Schwartzbauer | 437/209 |
| 5,409,563 | * | 4/1995 | Cathey | 156/643 |
| 5,544,103 | * | 8/1996 | Lambertson | 365/185.15 |
| 5,870,123 | * | 2/1999 | Lorenze, Jr. et al. | 347/65 |
| 5,929,469 | * | 7/1999 | Mimoto et al. | 257/208 |

FOREIGN PATENT DOCUMENTS

19606101A1   8/1997   (DE).

OTHER PUBLICATIONS

"Competitive gettering of copper in Czochralski silicon by implantation–induced cavities and internal gettering sites", Scott A. McHugo et al., Appl. Phys. Lett. 69, Nov. 1996, pp. 3060–3062.

* cited by examiner

*Primary Examiner*—Benjamin L. Utech
*Assistant Examiner*—Vanessa Perez-Ramos
(74) *Attorney, Agent, or Firm*—Herbert L. Lerner; Laurence A. Greenberg; Werner H. Stemer

(57) ABSTRACT

Residual oxygen impurities are eliminated from silicon wafers pulled from a crucible (Czochralski silicon). A multitude of trenches are etched into the back side of the crucible-pulled silicon wafer and the wafer is subsequently heat-treated at about 1100° C. The very large surface area at the front side of the silicon wafer allows oxygen impurities to diffuse out effectively. After the diffusion has been carried out, the trenches are filled with heavily doped polysilicon without leaving gaps.

10 Claims, 1 Drawing Sheet

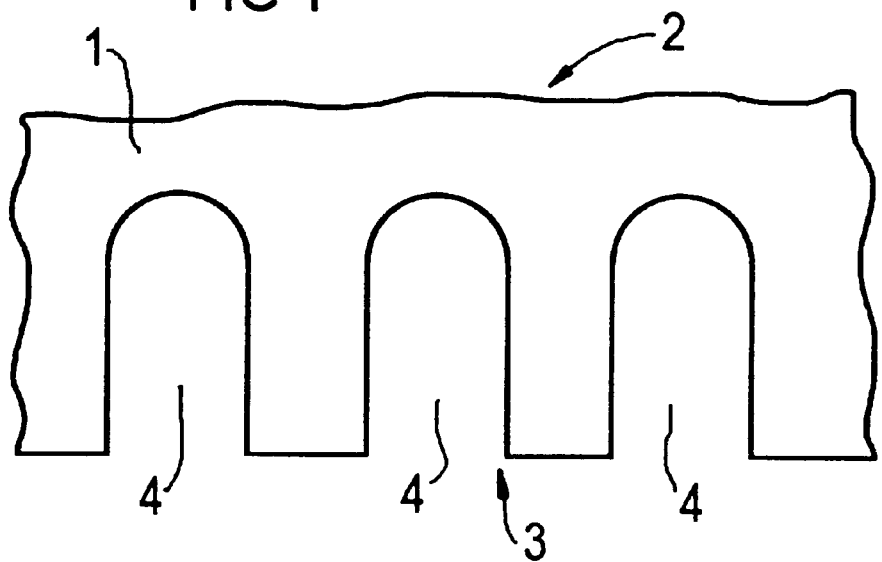
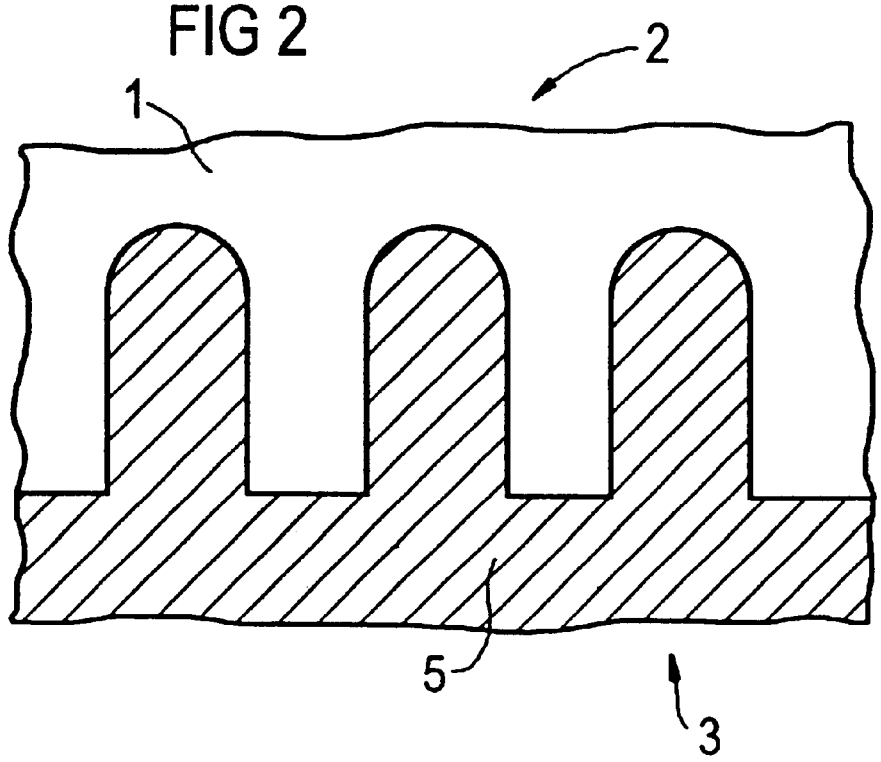

METHOD FOR ELIMINATING RESIDUAL OXYGEN IMPURITIES FROM SILICON WAFERS PULLED FROM A CRUCIBLE

BACKGROUND OF THE INVENTION

Field of the Invention

The invention relates to a method for eliminating residual oxygen impurities from silicon wafers pulled from a crucible.

The use of zone-refined silicon for the production of active components is generally known. It has however been found for vertically structured power semiconductor components that the use of zone-refined silicon in mass fabrication is limited, since only wafers with a diameter $\leq 150$ mm can be produced.

It is further known to use so-called epitaxial silicon wafers. These epitaxial silicon wafers are heavily doped silicon wafers to which a lightly doped epitaxial silicon layer is applied. However, the higher the threshold voltage for which the power semiconductor components to be processed are intended to be designed, the thicker the epitaxial layer must be. This in turn leads to high production costs.

Silicon wafers pulled from a crucible are also known. This is the so-called Czochralski process. It would make economic sense to use such crucible-pulled wafers, since wafers having very large diameters can be produced with the method. However, it has not to date been possible to use these Czochralski wafers in a number of applications, in particular for vertical power semiconductor components, since silicon wafers pulled from a crucible exhibit doping fluctuations (striations) and defects due to incorporated carbon and oxygen impurities, which impair the properties of the components.

The pulling of crystals from a melt using the Czochralski process is generally used for the production of single crystals. Using a suitably oriented seed crystal, which is briefly brought into contact with the molten surface and then pulled back up slowly, i.e. sometimes more slowly than 1 mm/min, it is possible to produce relatively large single crystals. The seed crystal may in this case be rotated, e.g. at 20 revolutions per minute, to ensure uniform crystallization as well as uniform incorporation of dopants provided by the melt.

It is important for the temperature profile at the boundary between the melt and the solid crystal to be vertically aligned, both in order for the growth to be free of mechanical stresses and for the doping to be homogeneous. If the surface of constant temperature is not planar, ring structures (striations) with microscopic doping fluctuations occur. Those doping fluctuations are a particular problem in the context of vertical power semiconductor components.

The choice of the crucible material is critical in the case of silicon. Available choices include quartz or graphite, graphite provided with a hard graphite surface layer (lustrous carbon), and boron nitride.

The high temperature of the melt, 1415° C., means that impurities enter the melt from the crucible material.

The two main residual impurities of silicon single crystals pulled from a crucible are small amounts of oxygen and carbon (about 0.02 ppm). The carbon impurities which occur, originating from the crucible material, are not in general of critical importance since carbon does not have a doping action in silicon. The oxygen impurities, however, are a cause for concern.

The oxygen impurities in silicon pulled from a crucible have long been used as "intrinsic" gettering sites. The silicon wafers are thereby thermally cycled to produce a defect-free zone near the surface. The thermal cycle consists of a first high temperature step at about 1100° C., followed by a low temperature step at about 650° C., and a second high temperature step at about 1000° C.

The thermal cycle, also referred to as a denuding process, is very strongly dependent on the original concentrations of oxygen and carbon in the silicon.

The first, high temperature step breaks up the oxygen deposits which are present, and thus makes it possible to diffuse the oxygen out from the surfaces of the silicon wafer. During the subsequent second, low temperature step, nuclei are produced in the bulk of the silicon wafer, i.e. below the denuded zone. Deposits grow at those nuclei during the subsequent high temperature step, and serve as gettering sites for oxygen, heavy metals and other defects during the production process.

The usable active zone in the case of this method, the so-called denuded zone, is only a few micrometers deep, thus rendering unsuitable the use of silicon wafer production, dealt with in this way, of active vertical power semiconductor components whose space charge zones extend about 100 micrometers or more into the bulk of the silicon wafer.

SUMMARY OF THE INVENTION

It is accordingly an object of the invention to provide a method of removing residual oxygen impurities from crucible-pulled silicon wafers, which overcomes the above-mentioned disadvantages of the heretofore-known methods of this general type and which is a substantially more effective method for eliminating the residual oxygen impurities that renders the wafers particularly suitable for use in the production of high-threshold vertical power semiconductor components.

With the foregoing and other objects in view there is provided, in accordance with the invention, a method for eliminating residual oxygen impurities from crucible-pulled silicon wafers, which comprises the following steps:

providing a silicon wafer with a front side and a back side;

etching a multitude of trenches into the back side of the silicon wafer;

heating the silicon wafer to a temperature of about 1100° C in a vacuum or an inert gas atmosphere;

subsequently filling the trenches with heavily doped polysilicon; and applying a metallization to the back side of the silicon wafer.

By virtue of this process, the oxygen deposits in the interior of the silicon wafer are broken up and they are allowed to diffuse effectively out of the silicon wafer through the surface area which is very much increased by the multitude of trenches.

Typically, the trenches are etched into the back side of the silicon wafer to a depth corresponding approximately to the space charge zone of the active vertical power semiconductor components to be processed subsequently.

In accordance with an added feature of the invention, the trenches are re-etched following the heating step. Typically, after the silicon wafer has been heated to the temperature of about 1100° C., the etched trench structure in the front side of the silicon wafer is re-etched in order to restore the precise trench contours, which may have been compromised during the heat treatment step.

In accordance with an additional feature of the invention, not only is the trench structure re-etched after the silicon wafer has been heated to a temperature of about 1100° C., but also the silicon wafer is again heated to a temperature of about 1100° C. after the re-etching. This causes the oxygen deposits to diffuse out more effectively. After this, the trench structure may again be re-etched. In all, the re-etching and heat treatment of the silicon wafer may be repeatedly performed.

In accordance with another feature of the invention, the step of filling the trenches comprises filling the trenches with heavily doped polysilicon by means of a plurality of successive epitaxy steps. This ensures that the trenches are filled without leaving gaps. All the methods known from DRAM technology may be used for this.

For special applications, the trenches may be only partly filled, then closed off for example with oxide.

In accordance with again a further feature of the invention, the silicon wafer and the epitaxially deposited polysilicon are of the same conductivity type. Alternatively, the silicon wafer and the heavily doped polysilicon are of the opposite conductivity type.

Typically, use is made of silicon wafers which have already been provided with active regions on their front side. While the front side of silicon wafers of this type, which have already been processed on the front side, is covered with a protective layer, for example an oxide layer, the heavily doped polysilicon layer is then introduced into the trenches by customary phosphorus application followed by diffusion.

If the trenches are not completely filled, then this doping, which takes place from the gas phase, will reliably reach as far as the active zone of the components, which therefore have a low-impedance connection to the back side. After the trenches have been filled with polysilicon, the back side is then provided in a known fashion with a metallization. The term metallization is in this context intended to mean the usual multilayer metallization systems, for example aluminum/ titanium/nickel/silver. Metallization systems of this type are described, for example, in the commonly owned application No. 08/802,134 (published German application DE 196 06 101 A1), which is herewith incorporated by reference.

In accordance with again another feature of the invention, the high-impedance silicon wafer is typically thinned to the desired thickness of the vertical power semiconductor components to be produced.

When use is made of an aluminum metallization on the front side, the etching and heat treatment of the silicon wafer are naturally carried out before this metallization on the front side is applied, since the metallization on the front side would be destroyed at the heat treatment temperatures according to the invention.

Other features which are considered as characteristic for the invention are set forth in the appended claims.

Although the invention is illustrated and described herein as embodied in a method for eliminating residual oxygen impurities from silicon wafers pulled from a crucible, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a partial sectional view taken through a Czochralski silicon wafer with trenches etched into it; and FIG. 2 is a similar sectional view of the silicon wafer after the trenches have been filled.

DESCRIPTION OF THE PREFERRED EMBODIMENTS

Referring now to the figures of the drawing in detail and first, particularly, to FIG. 1 thereof, there is seen a silicon wafer 1 with a front surface 2 and a back surface 3.

The silicon wafer 1 was pulled from a melt with the Czochralski process. The silicon is also referred to as Czochralski silicon. Specifically, a (111) oriented seed crystal was used in the present case, which was briefly brought into contact with the surface of the melt and then slowly pulled off upward. Dopants of the n type, in the present case arsenic, were added to the melt and the seed crystal.

The shown silicon wafer 1 was then sawed from the silicon ingot pulled in this way.

After the front side had been processed with active regions (not shown) and the front side had been provided with a protective layer, a multitude of trenches 4 were wet chemically etched into the back side 3 of the silicon wafer 1. The wet chemical etching is very greatly enhanced by the choice of the (111) orientation, since the etching of deep trenches and, in particular, the etching rate as well, are thereby greatly favored in comparison with a (100) orientation.

After the trenches had been etched, the silicon wafer 1 was heated to a temperature of about 1100° C. in a furnace under an inert gas atmosphere. Owing to the plurality of trenches 4, the surface area of the silicon wafer 1 on the back side 3 is very large, so that the oxygen deposits in the interior of the silicon wafer 1 are broken up during this high temperature step and can diffuse out.

After the oxygen impurities have diffused out, the trenches 4 formed in the back side 3 of the silicon wafer 1 were re-etched in order precisely to restore the trench contours and to eliminate possible impurities on the surface.

With reference to FIG. 2, a polysilicon layer 5 is then deposited. In the illustrated exemplary embodiment, this applied epitaxial layer is doped.

The spacing of the trenches may be chosen between one micrometer and about ten micrometers. The diameter of the trenches is typically between one micrometer and five micrometers.

We claim:

1. A method for eliminating residual oxygen impurities from crucible-pulled silicon wafers, which comprises the following steps:
   providing a crucible-pulled silicon wafer with a front side for active regions and a back side;
   etching a multitude of trenches into the back side of the silicon wafer;
   subsequently heating the silicon wafer to a temperature of about 1100° C. in one of a vacuum and an inert gas atmosphere and causing residual oxygen impurities to diffuse out of the silicon wafer for eliminating the residual oxygen impurities from the silicon wafer;
   subsequently filling the trenches with heavily doped polysilicon; and
   applying a metallization to the back side of the silicon wafer.

2. The method according to claim 1, which further comprises re-etching the multiplicity of trenches following the heating step.

3. The method according to claim 2, which further comprises, subsequently to the re-etching step, heating the silicon wafer to a temperature of about 1100° C. in one of a vacuum and an inert gas atmosphere.

4. The method according to claim 1, wherein the step of filling the trenches comprises filling the trenches with heavily doped polysilicon by means of a plurality of successive epitaxy steps.

5. The method according to claim 1, wherein the providing step comprises providing a silicon wafer with active regions on the front side thereof.

6. The method according to claim 5, wherein the etching step comprises etching the trenches into the back side of the silicon wafer such that the trenches extend into a region of a space charge zone of an active vertical power semiconductor component to be fabricated on the front side of the silicon wafer.

7. The method according to claim 6, wherein the filling step comprises epitaxially depositing the polysilicon, and wherein the silicon wafer and the polysilicon are of the same conductivity type.

8. The method according to claim 6, wherein the silicon wafer and the heavily doped polysilicon are of opposite conductivity type.

9. The method according to claim 1, wherein the silicon wafer is a high-impedance silicon wafer, and the method further comprises thinning the silicon wafer prior to the etching step.

10. The method according to claim 5, wherein the silicon wafer is a high-impedance silicon wafer, and the method further comprises thinning the silicon wafer prior to the etching step.

* * * * *